(12) United States Patent
Saito et al.

(10) Patent No.: US 11,954,292 B2
(45) Date of Patent: Apr. 9, 2024

(54) INPUT DEVICE AND INPUT SYSTEM

(71) Applicant: Panasonic Intellectual Property Management Co., Ltd., Osaka (JP)

(72) Inventors: Yuta Saito, Okayama (JP); Masaaki Yamabayashi, Okayama (JP); Kenichi Matsumoto, Okayama (JP); Ryo Nakae, Okayama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 177 days.

(21) Appl. No.: 17/439,472

(22) PCT Filed: Jun. 11, 2020

(86) PCT No.: PCT/JP2020/022943
§ 371 (c)(1),
(2) Date: Sep. 15, 2021

(87) PCT Pub. No.: WO2021/010064
PCT Pub. Date: Jan. 21, 2021

(65) Prior Publication Data
US 2022/0155903 A1 May 19, 2022

(30) Foreign Application Priority Data
Jul. 17, 2019 (JP) ................. 2019-132229

(51) Int. Cl.
*G06F 3/041* (2006.01)
*G06F 3/02* (2006.01)
(Continued)

(52) U.S. Cl.
CPC .............. *G06F 3/0445* (2019.05); *G06F 3/02* (2013.01); *H01H 3/02* (2013.01)

(58) Field of Classification Search
CPC ............... G06F 3/0443; G06F 3/04184; G06F 3/0412; G06F 3/041662;
(Continued)

(56) References Cited

U.S. PATENT DOCUMENTS

2001/0013463 A1* 8/2001 Asai ................ H01H 13/807
200/16 A
2007/0029172 A1* 2/2007 Choi ................ G06F 3/0238
200/1 B
(Continued)

FOREIGN PATENT DOCUMENTS

CN 102217183 A 10/2011
CN 109643179 A 4/2019
(Continued)

OTHER PUBLICATIONS

International Search Report of PCT application No. PCT/JP2020/022943 dated Sep. 15, 2020.
(Continued)

*Primary Examiner* — Md Saiful A Siddiqui
(74) *Attorney, Agent, or Firm* — Rimon P.C.

(57) ABSTRACT

An input device includes a fixed electrode, first and second movable electrodes, a first elastic member having a portion and being configured to deform so as to displace the portion of the first elastic member in accordance with a movement of the first movable electrode, a second elastic member having a portion and being configured to deform so as to displace the portion of the second elastic member in accordance with a movement of the second movable electrode, and a terminal configured to output a signal corresponding to a change in a capacitance between the first and second movable electrodes. The input device is responsible to various manipulations while not preventing a click feeling from being generated.

11 Claims, 11 Drawing Sheets

(51) Int. Cl.
  *G06F 3/044* (2006.01)
  *H01H 3/02* (2006.01)
(58) Field of Classification Search
  CPC ......... G06F 2203/04106; G06F 3/0445; G06F 3/00; G06F 3/0202; G06F 3/0447; G06F 3/04442; H01H 3/02; H01H 2239/006; H03K 2217/94036; H03K 2217/960755; H03K 2217/9651; H03K 17/98
  See application file for complete search history.

(56) References Cited

U.S. PATENT DOCUMENTS

| | | | | |
|---|---|---|---|---|
| 2007/0236463 | A1* | 10/2007 | Villain | H01H 25/041 345/169 |
| 2011/0260658 | A1* | 10/2011 | Pirk | H02N 1/006 318/116 |
| 2016/0170543 | A1 | 6/2016 | Kawamura | |
| 2016/0252413 | A1* | 9/2016 | Prest | G01L 1/22 307/118 |
| 2017/0084406 | A1* | 3/2017 | Wang | H01H 13/14 |
| 2018/0069550 | A1* | 3/2018 | Lehmann | H03K 17/975 |
| 2019/0196641 | A1* | 6/2019 | Ryu | G06F 3/0414 |
| 2020/0312585 | A1 | 10/2020 | Yano et al. | |

FOREIGN PATENT DOCUMENTS

| | | |
|---|---|---|
| JP | 6-064332 U | 9/1994 |
| JP | 2008-052620 | 3/2008 |
| JP | 2012-004129 | 1/2012 |
| WO | 2015/041268 | 3/2015 |
| WO | 2018/150741 | 8/2018 |

OTHER PUBLICATIONS

English Translation of Chinese Search Report dated Jun. 1, 2023 for the related Chinese Patent Application No. 202080040609.5.

* cited by examiner

INPUT DEVICE AND INPUT SYSTEM

CROSS-REFERENCE TO RELATED APPLICATIONS

This application is a U.S. national stage application of the PCT International Application No. PCT/JP2020/022943 filed on Jun. 11, 2020, which claims the benefit of foreign priority of Japanese patent application No. 2019-132229 filed on Jul. 17, 2019, the contents all of which are incorporated herein by reference.

TECHNICAL FIELD

The present disclosure relates to an input device used for input to various types of electronic apparatuses and to an input system equipped with the input device.

BACKGROUND ART

A conventional input device disclosed in PTL 1 includes a pressure sensor and an elastic body. The pressure sensor is disposed inside the elastic body. A user causes the elastic body to elastically deform by, e.g. twisting or pulling the elastic body. The input device detects the elastic deformation at that time with the pressure sensor, and outputs an input signal based on the pressure sensor.

CITATION LIST

Patent Literature

PTL 1: Japanese Patent Laid-Open Publication No. 2012-004129

SUMMARY

An input device includes a fixed electrode, first and second movable electrodes, a first elastic member having a portion and being configured to deform so as to displace the portion of the first elastic member in accordance with a movement of the first movable electrode, a second elastic member having a portion and being configured to deform so as to displace the portion of the second elastic member in accordance with a movement of the second movable electrode, and a terminal configured to output a signal corresponding to a change in a capacitance between the first and second movable electrodes.

The input device is responsible to various manipulations while not preventing a click feeling from being generated.

DESCRIPTION OF EMBODIMENTS

Note that the embodiments and modified examples described below are each merely one example of the present disclosure; therefore, the present disclosure is not limited to any of the embodiments and modified examples described below. Various modifications other than the embodiments and modified examples described below may be made according to a design concept or the like without departing from the scope of technical ideas of the present disclosure.

Each figure in explanations of the embodiments described below is a schematic diagram, and a ratio of size and thickness of each component is not necessarily an actual dimensional ratio.

Exemplary Embodiment 1

(1) Overview

Figure 1A:
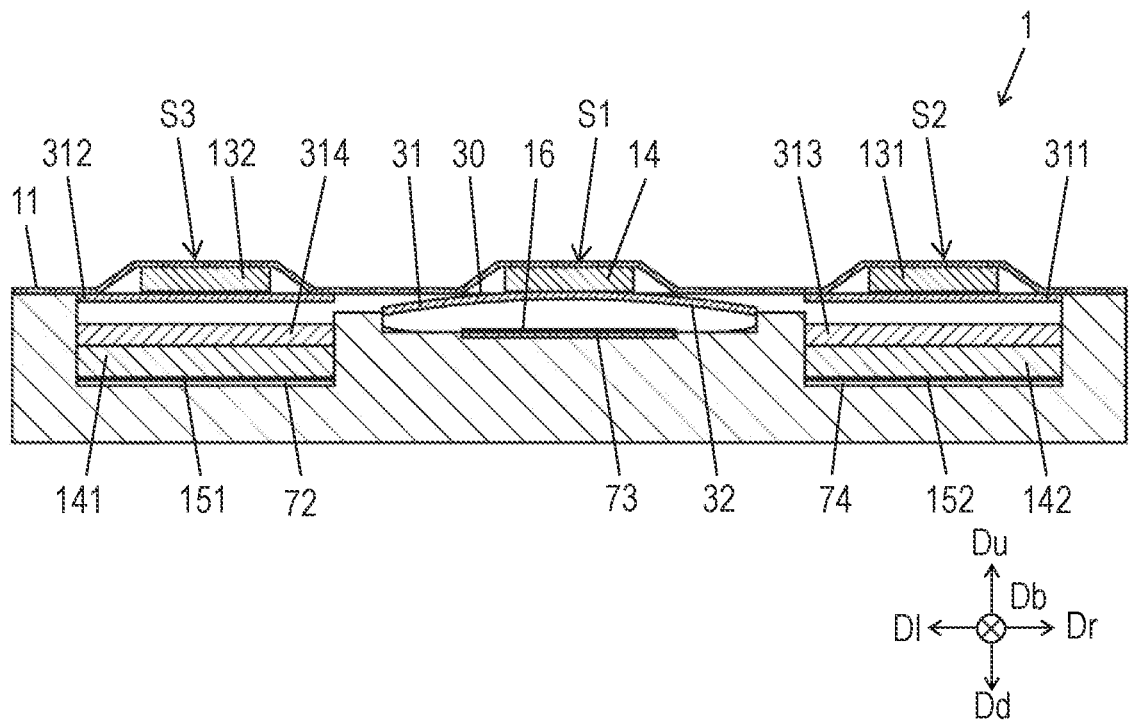
FIG. 1A is a cross-sectional view of an input device according to Exemplary Embodiment 1.
Figure 1B:
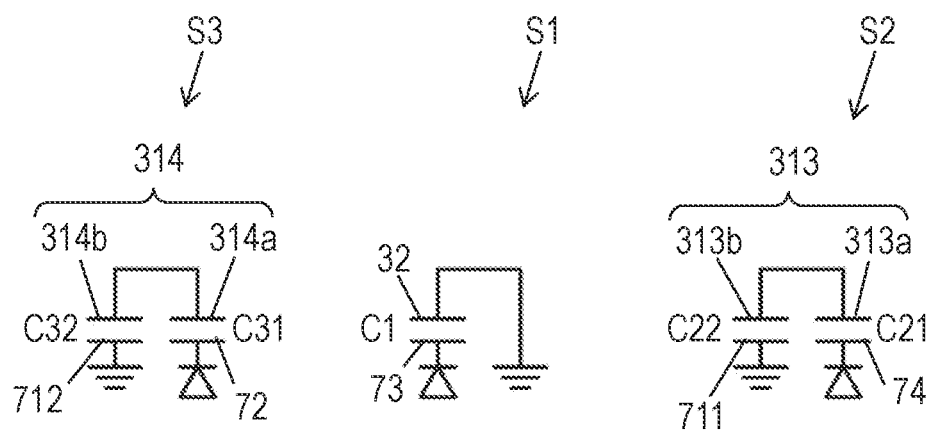
FIG. 1B is an equivalent circuit diagram of the input device shown in FIG. 1A.
Figure 2:
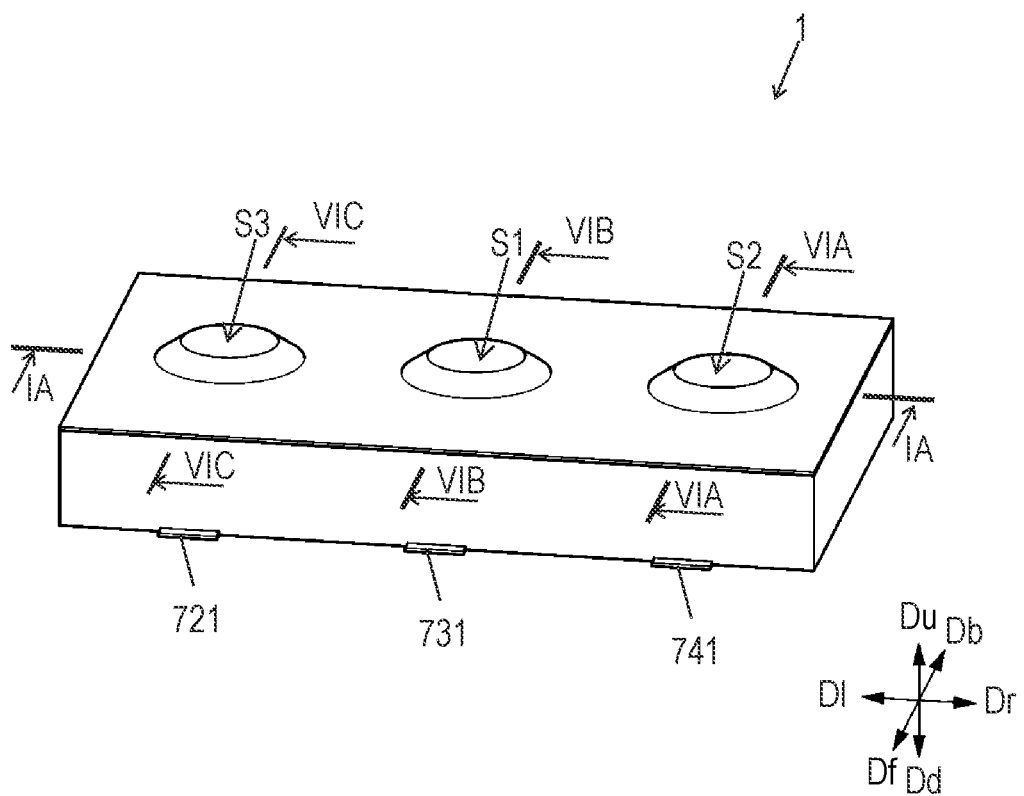
FIG. 2 is a perspective view of the input device according to Embodiment 1.
Figure 3A:
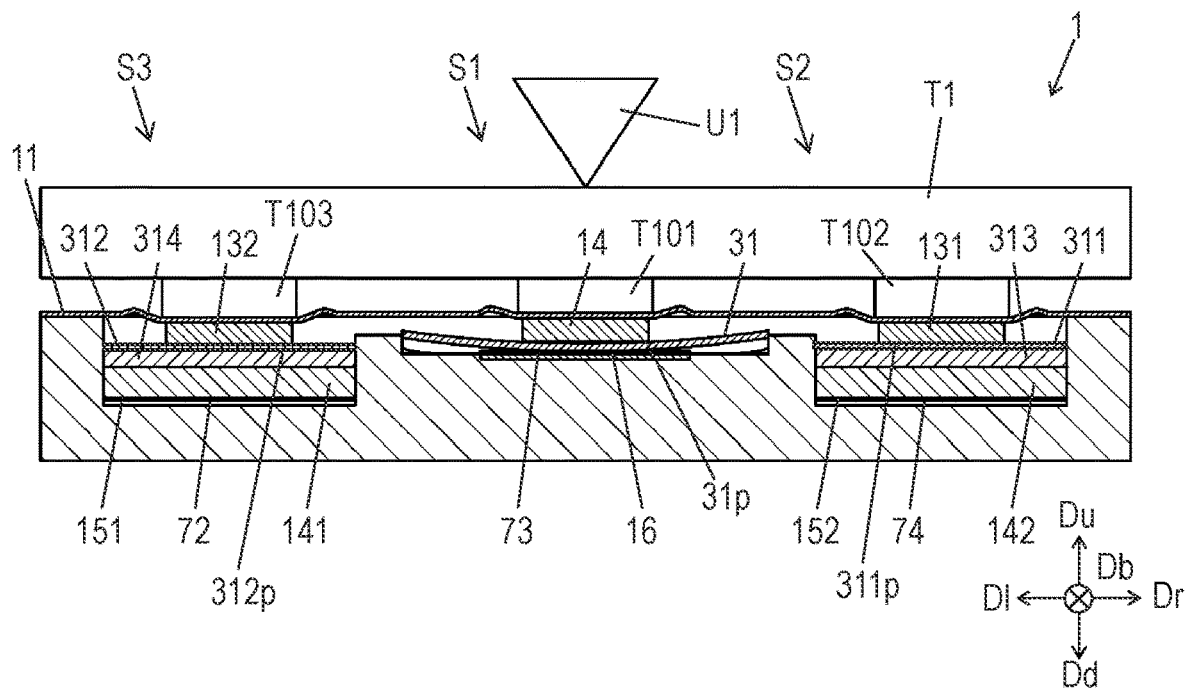
FIG. 3A is a schematic cross-sectional view of the input device in operation according to Embodiment 1.
Figure 3B:
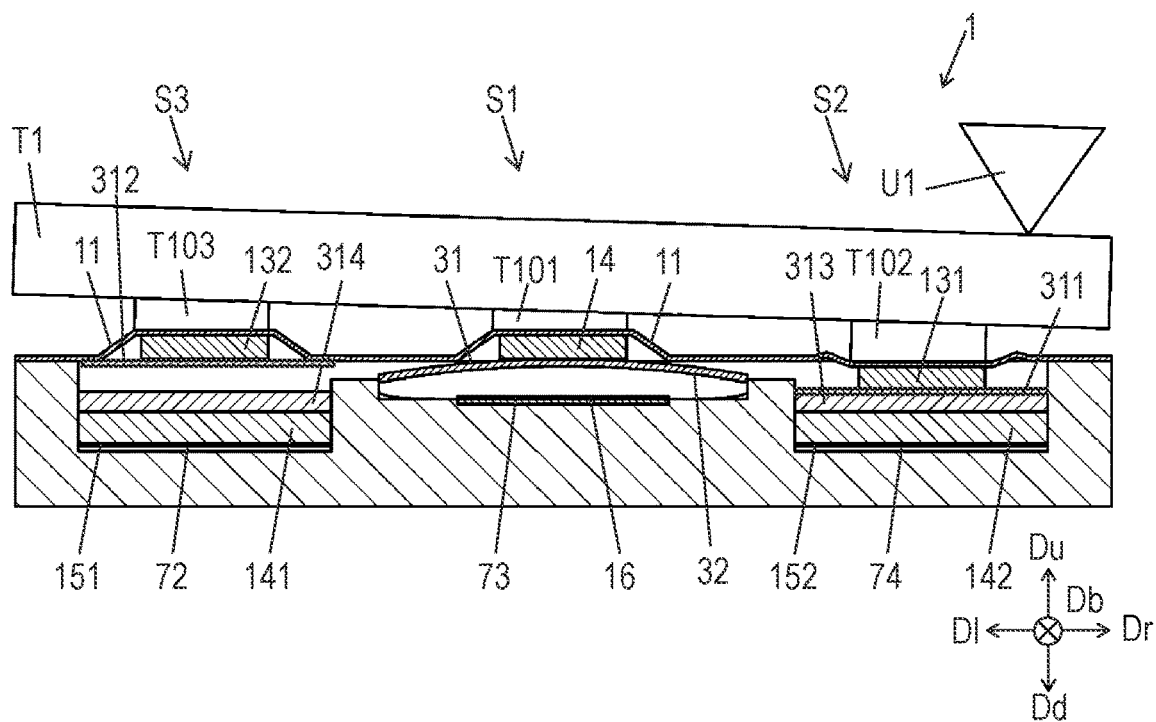
FIG. 3B is a schematic cross-sectional view of the input device in operation according to Embodiment 1.
Figure 4:
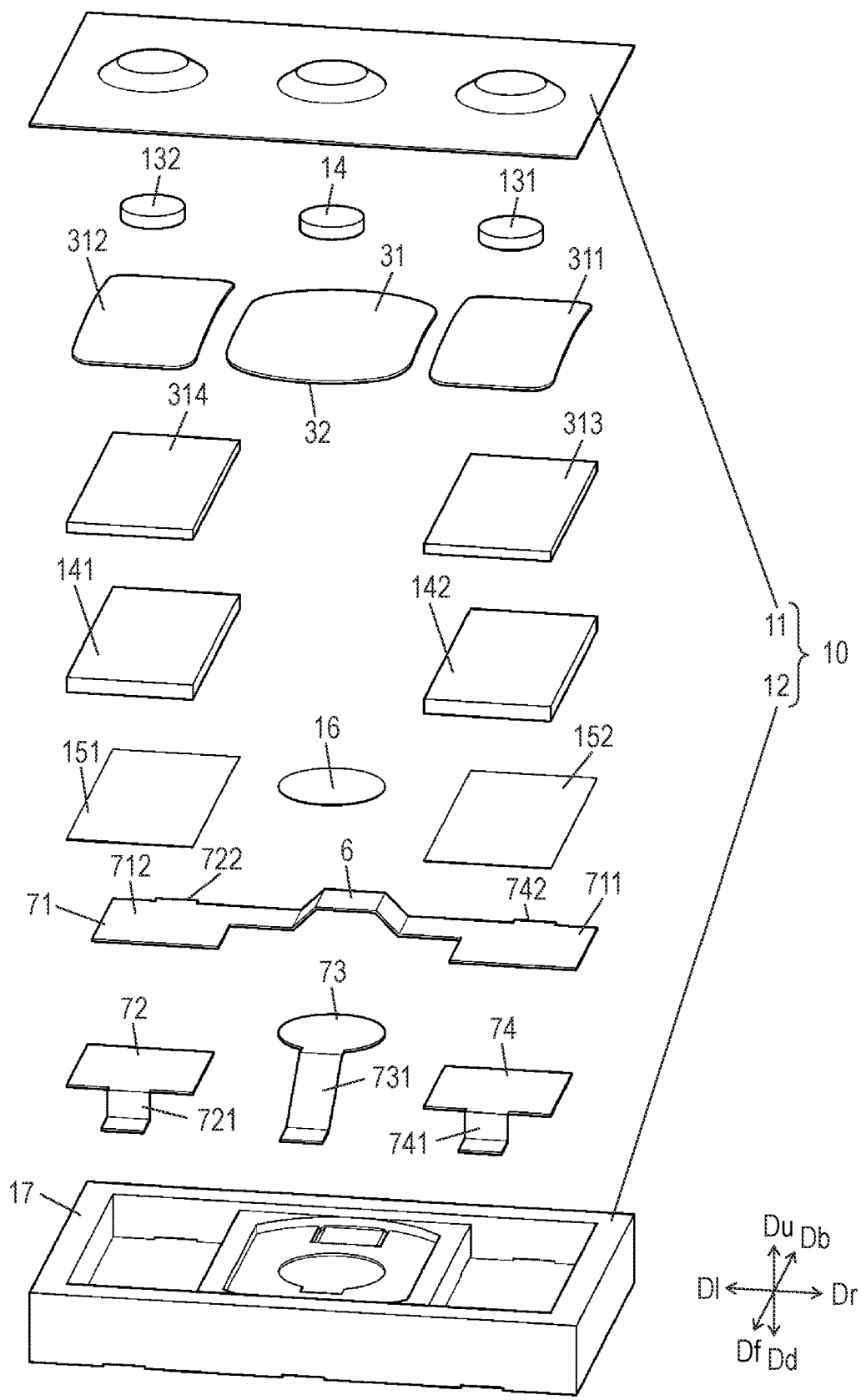
FIG. 4 is an exploded perspective view of the input device according to Embodiment 1.
Figure 5:
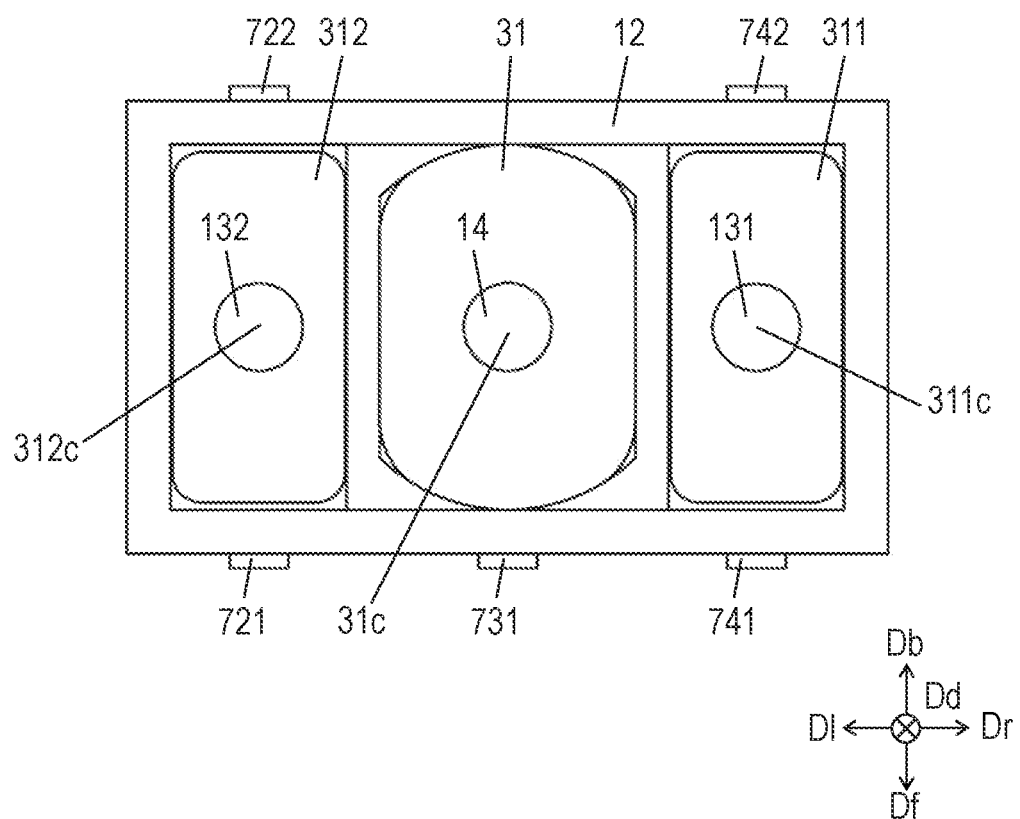
FIG. 5 is a plan view of the input device according to Embodiment 1.
Figure 6A:
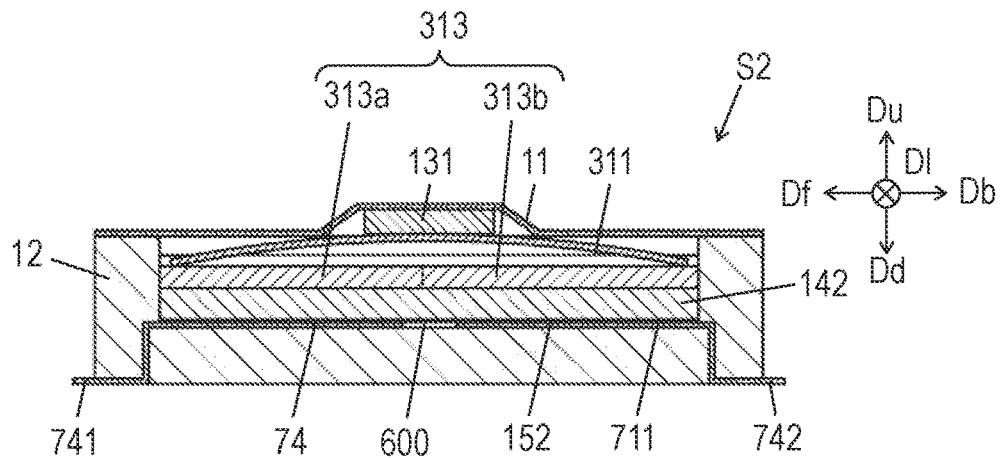
FIG. 6A is a cross-sectional view of the input device according to Embodiment 1.
Figure 6B:
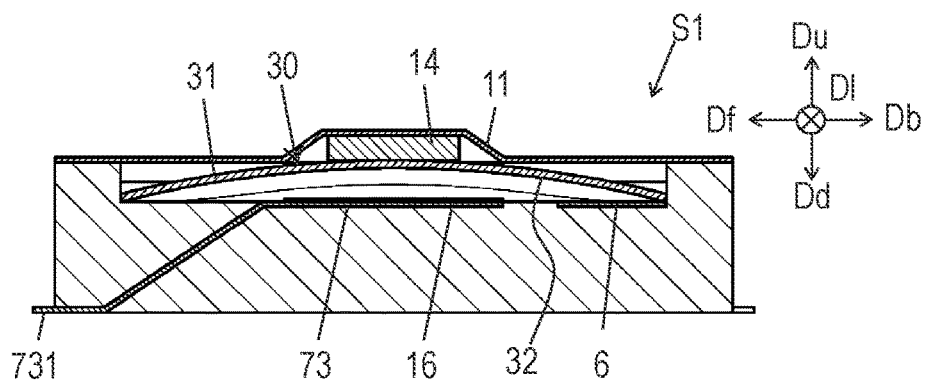
FIG. 6B is a cross-sectional view of the input device according to Embodiment 1.
Figure 6C:
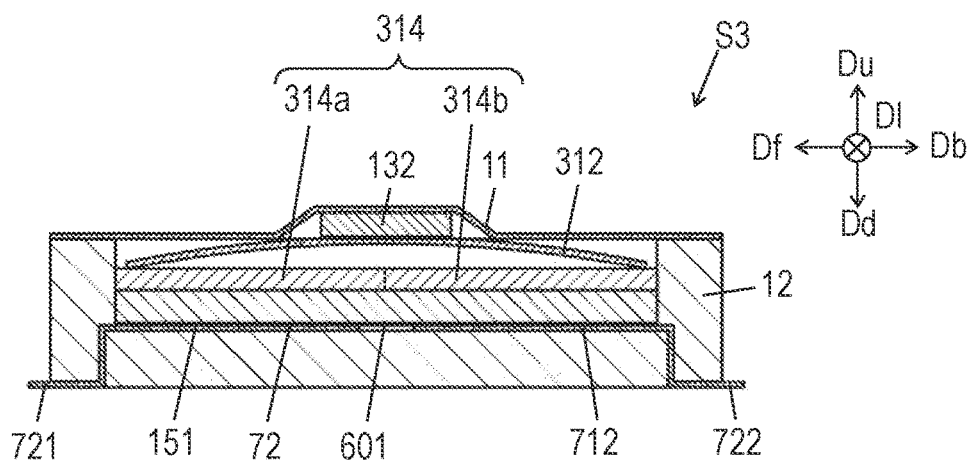
FIG. 6C is a cross-sectional view of the input device according to Embodiment 1.
Figure 7:
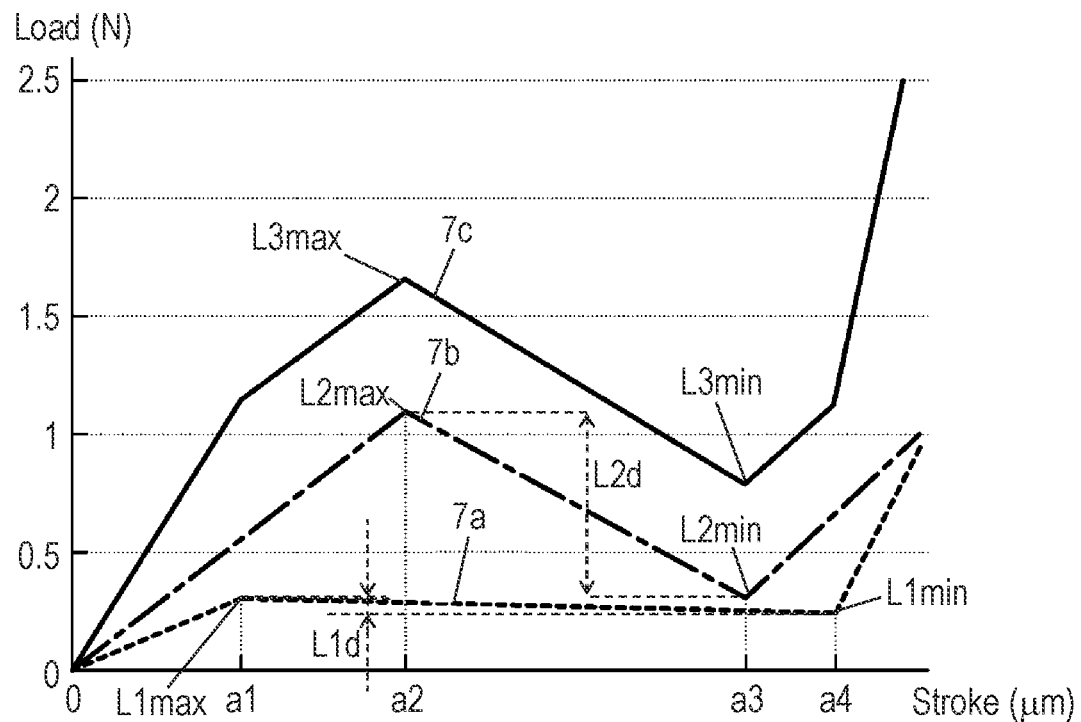
FIG. 7 shows correlations between a load and a stroke in the input device according to Embodiment 1.

FIG. 1A is a cross-sectional view of input device 1 according to Exemplary Embodiment 1. FIG. 1B is an equivalent circuit diagram of input device 1. FIG. 2 is a perspective view of input device 1. FIGS. 3A and 3B are schematic cross-sectional views of input device 1 in operation. FIG. 4 is an exploded perspective view of input device 1. FIG. 5 is a plan view of input device 1. FIGS. 6A-6C are cross-sectional views of input device 1. FIG. 7 shows correlations between a load and a stroke in input device 1. The cross-sectional view of FIG. 1A illustrates a cross section of input device 1 along line IA-IA shown in FIG. 2. The cross-sectional view of FIG. 6A illustrates a cross section of input device 1 along line VIA-VIA shown in FIG. 2. The cross-sectional view of FIG. 6B illustrates a cross section of input device 1 along line VIB-VIB shown in FIG. 2. The cross-sectional view of FIG. 6C illustrates a cross section of input device 1 along line VIC-VIC shown in FIG. 2.

As shown in FIGS. 1A and 4, input device 1 according to the embodiment includes touch-sensitive part S1 and one or more pressure-sensitive parts S2 and S3. The number of the pressure-sensitive parts may not necessarily be two.

Touch-sensitive part S1 includes movable electrode 32, elastic member 31, and fixed electrode 73 as shown in FIGS. 1A and 4. Elastic member 31 has pressing surface 30 that provides manipulating body U1 (see FIGS. 3A and 3B) with a click feeling when the manipulating body U1 applies a pressure to pressing surface 30. Manipulating body U1 is, e.g. a human fingertip (a part of a living body), but is not particularly limited. Manipulating body U1 may be a part of a living body and a device, such as a glove, covering the part. Manipulating body U1 may include an article, such as a pen-shaped manipulator, held by the living body.

In the conventional input device described in PTL 1, the pressure sensor detects complicated mechanical changes occurring inside the elastic body, but the input device can generate no click feeling. An input device responsive to various kinds of manipulations without preventing the generation of a click feeling.

Input device 1 according to the embodiment is responsive to various kinds of manipulations, as described later, without preventing the generation of a click feeling.

Figure 8:
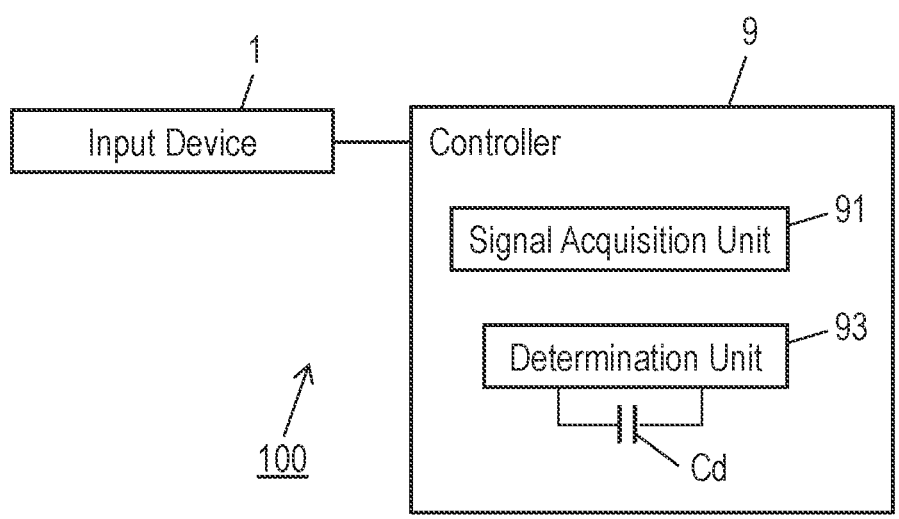
FIG. 8 is a block diagram of an input system according to Embodiment 1.

FIG. 8 is a block diagram of input system 100 according to Embodiment 1. Input system 100 includes input device 1, signal acquisition unit 91, and determination unit 93 as shown in FIG. 8. Signal acquisition unit 91 acquires an output signal output from input device 1. Determination unit 93 determines a manipulation of manipulating body U1 based on the output signal.

(2) Details (2.1) Overall Configuration

Input device 1 and the overall configuration of input system 100 according to the embodiment will be described below with reference to FIGS. 1A-8. In FIGS. 2 and 5, upward direction Du, downward direction Dd, leftward direction Dl, rightward direction Dr, forward direction Df, and backward direction Db are defined. Leftward direction Dl and rightward direction Dr are perpendicular to both upward direction Du and downward direction Dd. Forward direction Df and backward direction Db are perpendicular to leftward direction Dl, rightward direction Dr, upward direction Du, and downward direction Dd. These directions are not intended to define the direction of input device 1. In addition, the arrows indicating the directions in the figures are depicted only for the sake of explanation, and so they are devoid of substance.

Input system 100 includes input device 1 and controller 9, as shown in FIG. 8. Input system 100 is applicable to various types of electronic apparatuses. Input device 1 may be held in a housing of an electronic apparatus. Controller 9 may be accommodated inside the housing of the electronic apparatus. Controller 9 may output, based an input output from input device 1, a control signal to a circuit module accommodated inside the housing of the electronic apparatus.

Input device 1 includes touch-sensitive part S1 and two pressure-sensitive parts S2 and S3, as described above. Input device 1 further includes housing 10, push plates 131 and 132, and push plate 14, as shown in FIG. 4.

(2.2) Housing

Housing 10 of input device 1 accommodates touch-sensitive part S1, pressure-sensitive parts S2 and S3, and push plates 131, 132, and 14 therein, as shown in FIGS. 1A and 4. Housing 10 includes cover film 11 and body 12. Body 12 has a box shape having a flat quadrilateral shape (e.g., a flat square shape) and having an opening in surface 17 directed in upward direction Du of input device 1. Cover film 11 has a quadrilateral shape. Cover film 11 is attached to surface 17 of body 12 to cover the opening in surface 17 of body 12. The plan view of FIG. 5 illustrates input device 1 before cover film 11 is attached to body 12.

Cover film 11 and body 12 have electrically-insulating properties, and are made of, for example, resin material having electrically-insulating properties. Cover film 11 has flexibility. This configuration allows manipulating body U1 (see FIGS. 3A and 3B) to press, via cover film 11, touch-sensitive part S1 and pressure-sensitive parts S2 and S3 which are accommodated inside housing 10.

A pressing surface of cover film 11 including upper surfaces of touch-sensitive part S1 and two pressure-sensitive parts S2 and S3 functions as an input surface of input device 1.

Elastic member 31 of touch-sensitive part S1 has a dome shape with center 31c shown in the plan view of FIG. 5 while center 31c slightly protrudes in upward direction Du. Elastic member 31 has a flat and circular region at center 31c and the vicinity of the center. Push plate 14 is stably positioned on a lower surface of cover film 11 in downward direction Dd from center 31c. Pressing surface 30 is configured to be pressed in a pressing direction, i.e., downward direction Dd.

Two pressure-sensitive parts S2 and S3 are disposed at respective both sides of touch-sensitive part S1. The respective both sides are in leftward direction Dl and rightward direction Dr from the touch-sensitive part S1 when viewed in upward direction Du opposite to downward direction Dd that is the pressing direction of pressing surface 30. Elastic members 311 and 312 of two pressure-sensitive parts S2 and S3 have dome shape, As shown in the plan view of FIG. 5, centers 311c and 312c of the elastic members are slightly convex in upward direction Du (see FIGS. 6A and 6C). Two pressure-sensitive parts S2 and S3 have flat and circular regions at centers 311c and 312c of the parts and the vicinities thereof, respectively. Push plates 131 and 132 are stably positioned on a lower surface of cover film 11 in downward direction Dd from the regions at centers 311c and 312c, respectively.

(2.3) Touch-Sensitive Part

Touch-sensitive part S1 includes cover film 11, push plate 14, elastic member 31, movable electrode 32, insulating sheet 16, fixed electrode 73, and terminal 731, as shown in FIG. 6B.

Touch-sensitive part S1 is configured to output, from terminal 731, an analog electric signal that represents a change in a capacitance between movable electrode 32 and fixed electrode 73. Movable electrode 32 is disposed on a lower surface of elastic member 31 opposite to pressing surface 30 of elastic member 31. That is, movable electrode 32 is disposed on one of two surfaces of elastic member 31 in the upward and downward directions that is farther from cover film 11 than the other.

Touch-sensitive part S1 includes elastic member 31, movable electrode 32, insulating sheet 16, and fixed electrode 73, as shown in FIG. 4. Movable electrode 32, insulating sheet 16, and fixed electrode 73 are arranged in this order in downward direction Dd away from elastic member 31. That is, movable electrode 32 is located closest to elastic member 31 among the constituent components of touch-sensitive part S1.

Movable electrode 32 is made of an electrically-conductive material, such as a metal plate. A movement of movable electrode 32 is accompanied by deformation of elastic member 31. In other words, elastic member 31 deforms in accordance with a movement of movable electrode 32. In accordance with the embodiment, movable electrode 32 is formed unitarily on a lower surface of elastic member 31 opposite to pressing surface 30 by plating. In the case where elastic member 31 has electrical conductivity, elastic member 31 may function as movable electrode 32.

Fixed electrode 73 is made of an electrically-conductive material, such as a metal plate, having a disk shape. Fixed electrode 73 according to the embodiment faces movable electrode 32 across insulating sheet 16 in between. Terminal 731 is made of an electrically-conductive material, such as a metal plate, having a rectangular plate shape. Terminal 731 is electrically connected to fixed electrode 73. Terminal 731 protrudes from a lead-out hole formed in body 12 to the outside of housing 10 (see FIGS. 2 and 5).

Insulating sheet 16 is made of an insulating (dielectric) material having, e.g. a circular shape, as shown in FIG. 4. The outer shape of insulating sheet 16 is substantially identical to that of fixed electrode 73. In accordance with the embodiment, a thickness insulating sheet 16 in the upward and downward directions than a thickness of fixed electrode 73 in the upward and downward directions.

Touch-sensitive part S1 has pressing surface 30 and is configured to give a click feeling to manipulating body U1 that applies a pressure to pressing surface 30. Touch-sensitive part S1 includes elastic member 31 made of a plate having a dome shape and has pressing surface 30. Elastic member 31 is made of an elastic material, such as a metal plate or a rubber plate. Touch-sensitive part S1 may further include a flange and a leg that are unitarily formed on the peripheral edge of elastic member 31.

Pressing surface 30 is a convex surface with a center portion protruding. Upon pressing surface 30 having a pressure applied thereto, elastic member 31 elastically deforms, as shown in FIGS. 3A and 3B, thereby generating a click feeling. This elastic deformation causes the center portion of elastic member 31 to reverse itself, i.e., to change reversely its own shape from a convex shape to a concave shape (buckling). In touch-sensitive part S1, upon pressing surface 30 having a pressure applied thereto, pressing surface 30 elastically deforms to be concave, thereby giving a click feeling to manipulating body U1.

Push plate 14 is configured to cause elastic member 31 of touch-sensitive part S1 to elastically deform. Push plate 14 has a disk shape, as shown in FIG. 4. The outer shape of push plate 14 is smaller than the outer shape of touch-sensitive part S1. Push plate 14 is disposed between cover film 11 and the center portion of elastic member 31 (see FIGS. 1A and 6B). Push plate 14 is fixed to cover film 11 or elastic member 31. Push plate 14 is preferably fixed to cover film 11. Push plate 14 has electrically-insulating properties. In accordance with the embodiment, input device 1 further includes manipulation plates T1, T101, T102, and T103 (see FIGS. 3A and 3B). Manipulation plates T1, T101, T102, and T103 press push plates 131, 132, and 14 via cover film 11.

In accordance with the embodiment, movable electrode 32, insulating sheet 16, and fixed electrode 73 constitute capacitor C1 in the equivalent circuit of touch-sensitive part S1 shown in FIG. 1B. In accordance with the embodiment, movable electrode 32 is integrally formed on the lower surface of elastic member 31 i.e., on the pressing surface of elastic member 31 having a dome shape. This configuration produces a cavity between movable electrode 32 and insulating sheet 16, accordingly producing a very small capacitance Ca of capacitor C1.

(2.4) Pressure-Sensitive Part

Two pressure-sensitive parts S2 and S3 are pressure-sensitive sensors as described above, and are disposed at the respective sides (in the leftward and rightward directions) of touch-sensitive part S1 when viewed in the pressing direction (downward direction Dd) of pressing surface 30 (see FIGS. 2 and 5). Pressure-sensitive parts S2 and S3 are disposed individually adjacent to touch-sensitive part S1 at the respective both sides of touch-sensitive part S1. In this case, two pressure-sensitive parts S2 and S3 have the same configuration; however, the two pressure-sensitive parts may have different configurations.

Pressure-sensitive part S2 includes movable electrode 313 made of an electrically conductive material, such as a metal plate having a rectangular flat plate shape, fixed electrodes 711 and 74, conductive sheet 142, insulating sheet 152, elastic member 311, push plate 131, and terminals 741 and 742, as shown in FIGS. 1A and 4. Pressure-sensitive part S3 includes movable electrode 314 made of an electrically-conductive material, such as a metal plate having a rectangular flat plate shape, fixed electrodes 712 and 72, conductive sheet 141, insulating sheet 151, elastic member 312, push plate 132, and terminals 721 and 722, as shown in FIGS. 1A and 4. A movement of movable electrode 313 is accompanied by deformation of elastic member 311. In other words, elastic member 311 deforms in accordance with the movement of movable electrode 313. That is, pressure-sensitive part S2 is a pressure-sensitive sensor that detects changes in a capacitance between movable electrode 313 and each of fixed electrodes 711 and 74. Similarly, pressure-sensitive part S3 is a pressure-sensitive sensor that detects a change in a capacitance between movable electrode 314 and each of fixed electrodes 712 and 72. Fixed electrode 711 is connected to fixed electrode 712 via connecting part 6. Fixed electrode 711, fixed electrode 712, and connecting part 6 unitarily formed to constitute fixed unitary electrode 71. Movable electrode 32 disposed on the lower surface of elastic member 31 of touch-sensitive part S1 contacts connecting part 6, thereby being grounded.

Fixed electrodes 74 and 711 are arranged on a plane in the frontward and backward directions such that gap 600 is formed between the fixed electrodes (see FIG. 6A). That is, fixed electrodes 74 and 711 are arranged in the plane along the frontward and backward directions to form gap 600 between the fixed electrodes. In accordance with the embodiment, fixed electrode 74 is disposed in forward direction Df with respect to gap 600, and fixed electrode 711 is disposed in backward direction Db with respect to gap 600. Fixed electrode 74 is disposed in forward direction Df with respect to fixed electrode 711. Fixed electrodes 74 and 711 face movable electrode 313. Movable electrode 313 includes parts 313a and 313b. Part 313a is located in forward direction Df with respect to gap 600 when viewed in downward direction Dd (upward direction Du). Part 313b is located in backward direction Db with respect to gap 600 when viewed in downward direction Dd (upward direction Du). Fixed electrode 74 faces part 313a of movable electrode 313 in downward direction Dd (upward direction Du). Fixed electrode 711 faces part 313b of movable electrode 313 in downward direction Dd (upward direction Du). Fixed electrode 74 does not face part 313b of movable electrode 313 in downward direction Dd (upward direction Du). Fixed electrode 711 does not face part 313a of movable electrode 313 in downward direction Dd (upward direction Du).

Fixed electrode 74 has the same area as fixed electrode 711 within tolerance.

Fixed electrodes 72 and 712 are disposed in a plane and in the frontward and backward directions to form gap 601 (see FIG. 6C). That is, fixed electrodes 72 and 712 are arranged in the same plane in the frontward and backward directions to form gap 601. In accordance with the embodiment, fixed electrode 72 is disposed in forward direction Df with respect to gap 601 while fixed electrode 712 is disposed in backward direction Db with respect to gap 601. Fixed electrodes 72 and 712 face movable electrode 314. Movable electrode 314 includes part 314a and part 314b. Part 314a is located in forward direction Df with respect to gap 601 when viewed in downward direction Dd (upward direction Du). Part 314b is located in backward direction Db with respect to gap 601 when viewed in downward direction Dd (upward direction Du). Fixed electrode 72 faces part 314a of movable electrode 314 in downward direction Dd (upward direction Du). Fixed electrode 712 faces part 314b of movable electrode 314 in downward direction Dd (upward direction Du). Fixed electrode 72 does not face part 314b of movable electrode 314 in downward direction Dd (upward direction Du). Fixed electrode 712 does not face part 314a of movable electrode 314 in downward direction Dd (upward direction Du).

Fixed electrode 72 has the same area as fixed electrode 712 within tolerance.

Each of fixed electrodes 711, 712, 72, and 74 is made of an electrically-conductive material, such as a metal plate, having a rectangular flat plate shape, as shown in FIGS. 1A and 4. In accordance with the embodiment, fixed electrode 711 of pressure-sensitive part S2 is coupled to fixed electrode 712 of pressure-sensitive part S3 via connecting part 6. Connecting part 6 is made of an electrically-conductive material, such as a metal plate. In accordance with the embodiment, fixed electrodes 711 and 712 are coupled to each other; however, they may not necessarily be coupled to each other.

Each of terminals 721, 722, 741, and 742 is made of an electrically-conductive material, such as a metal plate, having a rectangular flat plate shape, as shown in FIG. 5. Terminal 721 is electrically connected to fixed electrode 72. Terminal 722 is electrically connected to fixed electrode 712. Terminal 741 is electrically connected to fixed electrode 74. Terminal 742 is electrically connected to fixed electrode 711. Terminals 721, 722, 741, and 742 protrude from respective lead-out holes formed in body 12 to the outside of housing 10 (see FIG. 5). Fixed electrodes 711 and 712 connected to connecting part 6 (see FIG. 4) allow terminals 722 and 742 to be electrically connected to each other. In accordance with the embodiment, terminals 722 and 742 are connected to each other via connecting part 6 and grounded.

The surface of movable electrode 313 of pressure-sensitive part S2 has a size and shape identical to those of the surface of movable electrode 314 of pressure-sensitive part S3. Pressure-sensitive part S2 and pressure-sensitive part S3 overlap movable electrode 313 and movable electrode 314, respectively, when viewed in the pressing direction (upward and downward directions) of cover film 11. Two pressure-sensitive parts S2 and S3 are disposed at respective both sides of touch-sensitive part S1 when viewed in the pressing direction of pressing surface 30 of touch-sensitive part S1. That is, two of pressure-sensitive part S2 and pressure-sensitive part S3 are disposed in rightward direction Dr and leftward direction Dl with respect to touch-sensitive part S1 between pressure-sensitive parts S2 and S3 when viewed in the pressing direction of pressing surface 30 of touch-sensitive part S1. In other words, a pair of movable electrodes 313 and 314 are disposed at respective both sides of movable electrode 32 when viewed in the pressing direction of movable electrode 32.

When manipulating body U1 presses pressure-sensitive part S2 via cover film 11, push plate 131 presses elastic member 311, thereby causing movable electrode 313 to move in downward direction Dd. Then, an analog electric signal that represents a change in capacitances of capacitors C21 and C22 (see FIG. 1B) is output to controller 9 via terminal 741. Capacitors C21 and C22 are formed between movable electrode 313 moved at this time and the elements that are conductive sheet 142, insulating sheet 152, and fixed electrodes 74 and 711. That is, input device 1 outputs, from terminal 741 to controller 9, the electric signal that represents change in capacitances of capacitors C21 and C22.

In pressure-sensitive part S3, when manipulating body U1 presses pressure-sensitive part S3 via cover film 11, push plate 132 presses elastic member 312, thereby causing movable electrode 314 to move in downward direction Dd, Similarly to pressure-sensitive part S3. Then, an analog electric signal that represents change in capacitances of capacitors C31 and C32 (see FIG. 1B) is output to controller 9 via terminal 721. Capacitors C31 and C32 are formed between movable electrode 314 thus-moved at this time and the elements that are conductive sheet 141, insulating sheet 151, and fixed electrodes 72 and 712. That is, input device 1 outputs, from terminal 721 to controller 9, the electric signal that represents a change in the capacitances of capacitors C31 and C32.

In accordance with the embodiment, fixed electrode 74 and part 313a of movable electrode 313 constitute capacitor C21 of the equivalent circuit of pressure-sensitive part S2 (see FIG. 1B). Fixed electrode 711 and part 313b of movable electrode 313 constitute capacitor C22 of the equivalent circuit of pressure-sensitive part S2 (see FIG. 1B).

Since parts 313a and 313b of movable electrode 313 are connected to each other, capacitors C21 and C22 are connected in series to each other.

Since the areas of fixed electrodes 74 and 711 are identical to each other, the capacitance of capacitor C21 generated between fixed electrode 74 and part 313a of movable electrode 313 is identical to that of capacitor C22 generated between fixed electrode 711 and part 313b of movable electrode 313.

Fixed electrode 72 and part 314a of movable electrode 314 constitute capacitor C31 of the equivalent circuit of pressure-sensitive part S3 (see FIG. 1B). Fixed electrode 712 and part 314b of movable electrode 314 constitute capacitor C32 of the equivalent circuit of pressure-sensitive part S3 (see FIG. 1B).

Since parts 314a and 314b of movable electrode 314 are connected to each other, capacitors C31 and C32 are connected in series to each other.

Since the areas of fixed electrodes 72 and 712 are identical to each other, the capacitance of capacitor C31 generated between fixed electrode 72 and part 314a of movable electrode 314 is identical to that of capacitor C32 generated between fixed electrode 712 and part 314b of movable electrode 314.

(2.5) Controller

Controller 9 of input system 100 is implemented by, e.g. a microcontroller mainly composed of a central processing unit (CPU) and a memory. In other words, controller 9 is implemented by a computer including a CPU and a memory. In this case, the computer functions as controller 9 by causing the CPU to execute a program stored in the memory. The program is previously recorded in the memory; however, the program may be provided through a telecommunication line, such as the Internet or, alternatively, provided by being recorded in a non-transitory recording medium, such as a memory card.

Controller 9 is electrically connected to input device 1. Controller 9 includes signal acquisition unit 91 and determination unit 93, as shown in FIG. 8. In other words, controller 9 has both the function as signal acquisition unit 91 and the function as determination unit 93.

Signal acquisition unit 91 is configured to acquire output signals output from terminal 731 of touch-sensitive part S1 and terminals 741 and 721 of pressure-sensitive parts S2 and S3. Determination unit 93 is configured to determine, based on the output signals acquired from input device 1, manipulations of manipulating body U1 that manipulates input device 1.

The capacitances of touch-sensitive part S1 and pressure-sensitive parts S2 and S3 may be acquired by various methods. A switched-capacitor method is applicable. In the switched-capacitor method, the capacitances (changes in the capacitances) of touch-sensitive part S1 and pressure-sensitive parts S2 and S3 are detected based on the quantities of electric charges stored in capacitors C1-C32. Controller 9 alternately repeats in a predetermined period of time, a charging process of sequentially charging capacitors C1-C32 and a discharging process of sequentially discharging the capacitors. In the discharging process, the charge stored in capacitors C1-C32 by the charging process is discharged, and determination capacitor Cd of determination unit 93 is charged. When the voltage across capacitor Cd reaches a predetermined value, the controller stops the discharging process, and then, starts the charging process. That is, the larger the capacitance, the more times in the predetermined period the voltage across capacitor Cd reaches the predetermined value. Therefore, controller 9 determines the changes of the capacitances based on the number of times in the predetermined period the voltage across capacitor Cd reaches the predetermined value.

Then, determination unit 93 according to the embodiment determines various manipulations (manipulation inputs) of manipulating body U1 based on the combination of detection results of the changes in the capacitances of touch-sensitive part S1, pressure-sensitive part S2, and pressure-sensitive part S3. The detection results of manipulations may include, for example, touching, pushing, and clicking manipulations on touch-sensitive part S1, touching manipulations on pressure-sensitive parts S2 and S3. The "pushing" as referred to herein means the state in which no click feeling is generated despite of pressing touch-sensitive part S1.

(2.6) Operation

A manipulation of center-pressing of input device 1 will be described below. The "center-pressing" as referred to herein means a manipulation causing touch-sensitive part S1 and pressure-sensitive parts S2 and S3 which are adjacent to touch-sensitive part S1 to be evenly pressed (see FIG. 3A). In this manipulation, manipulation plate T1 is pressed in downward direction Dd from above touch-sensitive part S1, that is, from above manipulation plate T101. First, the state before touch-sensitive part S1, i.e., manipulation plate T1 is pressed will be described. In this state, a cross-sectional view of touch-sensitive part S1 in the frontward and backward directions is shown in FIG. 6B. Movable electrode 32, insulating sheet 16, and fixed electrode 73 constitute capacitor C1. In accordance with the embodiment, movable electrode 32 is integrally disposed on the lower surface of elastic member 31 having a domed shape opposite to pressing surface 30. This configuration produces a cavity between movable electrode 32 and insulating sheet 16, hence causing capacitance Ca of capacitor C1 to be very small.

Next, an operation in which touch-sensitive part S1 is pressed will be described below. When the center portion (in the vicinity of push plate 14) of pressing surface 30 of elastic member 31 is pressed, a pressure is applied to elastic member 31 to move movable electrode 32 in downward direction Dd. Then, when the amount of a push-in movement (stroke) of pressing surface 30 increases and reaches a predetermined value, elastic member 31 elastically deforms, and reverses the shape of elastic member 31 such that pressing surface 30 of elastic member 31 becomes a concave surface and the lower surface thereof becomes a convex surface. Such a reversing generates a click feeling. Elastic member 31 includes portion 31p. Elastic member 31 deforms so as to displace portion 31p in accordance with the movement of movable electrode 32. Elastic member 31 contacts insulating sheet 16 on fixed electrode 73 upon elastically deforming, thereby constitutes capacitor C1. That is, the distance between the center portion of pressing surface 30 and fixed electrode 73 largely changes. Such a large change in the distance results in a large change in capacitance Ca.

Next, operations of pressure-sensitive parts S2 and S3 will be described below. When pressure-sensitive part S2 is pressed, as the amount of a push-in movement of elastic member 311 increases, movable electrode 313 moves in downward direction Dd, leading to changes (increases) in capacitances of capacitors C21 and C22. Similarly, when pressure-sensitive part S3 is pressed, as the amount of a push-in movement of elastic member 312 increases, movable electrode 314 moves in downward direction Dd, leading to changes (increases) in capacitances of capacitors C31 and C32. Elastic members 311 and 312 include portions 311p and 312p, respectively. Elastic members 311 and 312 deform so as to displace portions 311p and 312p in accordance with the movements of movable electrodes 313 and 314, respectively. Since capacitors C21 and C22 constituted in pressure-sensitive part S2 are connected in series to each other, the total capacitance of the capacitors of pressure-sensitive part S2 is a half of each of the capacitances of capacitors C21 and C22. However, even in cases where manipulating body U1 is a device, such as a glove, other than a human body, the sensitivity remains unchanged. Similarly, since two capacitors C31 and C32 constituted in pressure-sensitive part S3 are connected in series to each other, the total capacitance of pressure-sensitive part S3 is a half of each of the capacitances of capacitors C31 and C32. However, even in cases where manipulating body U1 is a device, such as a glove, other than a human body, the sensitivity remains unchanged. Equivalent circuit diagrams of pressure-sensitive parts S2 and S3 are shown in FIG. 1B.

When touch-sensitive part S1 is pressed, the human body, i.e., manipulating body U1 serves as a pseudo ground, so that one end of capacitor C1 constituted in touch-sensitive part S1 is grounded. FIG. 7 shows correlations between a load (N) and pressing strokes (μm) at this moment. The load is applied to elastic member 31 of touch-sensitive part S1 and movable electrodes 311 and 312 of pressure-sensitive parts S2 and S3, thereby yielding their pressing strokes. Profile 7b indicated by the dot-and-dash line in FIG. 7 shows the correlation between the resulting stroke and the load on elastic member 31 of touch-sensitive part S1. Profile 7a indicated by the dotted line in FIG. 7 shows the correlation between the resulting strokes and the load on elastic members 311 and 312 of pressure-sensitive parts S2 and S3.

Profile 7c indicated by the solid line in FIG. 7 shows the correlation between the resulting stroke and the load on the entire of touch-sensitive part S1 and pressure-sensitive parts S2 and S3. These strokes correspond to the amounts of deformations of elastic members 31, 311, and 312.

Profile 7b of elastic member 31 of touch-sensitive part S1 shows that, until the stroke, i.e., the amount of a push-in movement of elastic member 31 increases from 0 (zero) to reach value a2, the load increases according to the increasing of the stroke. Then, when the stroke shown in the profile exceeds value a2, the load starts to decrease although the stroke increases. This behavior means that elastic member 31 elastically deforms at value a2 of the stroke, thereby generating a click feeling. When the stroke further increases, the load starts to increase again at value a3 of the stroke. In the correlation between the load and the stroke, a region where the direction of the change of the load is reversed appears.

Profile 7a of elastic members 311 and 312 of pressure-sensitive parts S2 and S3 shows that, until the stroke increases from 0 (zero) to reach value a1, the load increases as the stroke increases. The load does not substantially change in a range from value a1 of the stroke to value a4 of the stroke although the stroke increases. Or, even if the load decreases, the amount of the decrease of the load is small. When the stroke further increases to exceed value a4, the load increases in accordance with the increase of the stroke.

In profile 7b, the load becomes equal to local maximum value L2max at value a2 of the stroke, and becomes equal to local minimum value L2 min at value a3 of the stroke. In profile 7a, the load becomes local maximum value L1max at value a1 of the stroke, and becomes equal to local minimum value L1min at value a4 of the stroke. In the correlations between the loads and the strokes, difference L1d between local maximum value L1max and local minimum value L1min of elastic members 311 and 312 in profile 7a is smaller than difference L2d between local maximum value L2max and local minimum value L2 min of elastic member 31 in profile 7b. Alternatively, profile 7a of the correlation between the loads and strokes of elastic members 311 and 312 may not necessarily have local maximum value L1max and local minimum value L1min. For this reason, elastic members 311 and 312 may more hardly deform than elastic member 31 and may be made of material having a smaller force for manipulation, a lower click rate, and a longer stroke. Here, the click rate is defined as, e.g. (P1−P2)/P1, where P1 is local maximum load P1 causing the deforming of the elastic member, and P2 is local minimum load P2 immediately after the deforming of the elastic member. As a result, as shown in profile 7c in FIG. 7, when the stroke of the entire of touch-sensitive part S1 and pressure-sensitive parts S2 and S3 increases from 0 (zero) to reach value a2, the load increases and reaches local maximum value L3max, and then, changes from the increasing to decreasing similarly to elastic member 31. When the stroke of the whole of touch-sensitive part S1 and pressure-sensitive parts S2 and S3 increases from value a2 to reach value a3, the load decreases and reaches local minimum value L3 min, and then, changes from the decreasing to increasing similarly to elastic member 31. As described above, even when pressure-sensitive parts S2 and S3 are pressed simultaneously with the pressing of touch-sensitive part S1, the above operation prevents occurrence of additional click feeling despite of the increased stroke, resulting in no influence on the click feeling of touch-sensitive part S1.

In the above description, touch-sensitive part S1 and pressure-sensitive parts S2 and S3 are pressed evenly, but may not necessarily be pressed evenly.

Next, as an example of the uneven pressing, an operation of one-sided pressing of input device 1 will be described below. The one-sided pressing as referred to herein means an operation in which manipulation plate T1 is pressed at a position largely deviating in leftward direction Dl or rightward direction Dr with respect to the center of manipulation plate T1 located in upward direction Du from touch-sensitive part S1 (see FIG. 3B). In this operation, one of pressure-sensitive parts S2 and S3 corresponding to the pressed position is pressed while touch-sensitive part S1 and the other of pressure-sensitive parts S2 and S3 are not pressed. The pressed pressure-sensitive part is located at a position deviating in a corresponding one of leftward direction Dl and rightward direction Dr, that is, a position deviating in the direction in which the one-sided pressing is applied. Here, the operation of the one-sided pressing in which pressure-sensitive part S2 is pressed will be described. When manipulation plate T1 is pressed from a position in upward direction Du from pressure-sensitive part S2 to press pressure-sensitive part S2, the stroke, i.e., the amount of the push-in movement of elastic member 311 increases, and causes movable electrode 313 to move in downward direction Dd accordingly. Then, an analog electric signal that indicates a change in the capacitance of capacitor C22 is output from terminal 741. When one-sided pressing is applied to pressure-sensitive part S3, an analog electric signal that indicates a change in the capacitance of capacitor C32 is output from terminal 721. Controller 9 monitors the change in the capacitances of touch-sensitive part S1 and pressure-sensitive parts S2 and S3, and determines the manipulation inputted from manipulating body U1 to input device 1. Then, controller 9 outputs a control signal corresponding to the determined manipulation to the outside, such as other circuit modules.

(2.7) Usage

A method of using input device 1 will be briefly described below.

Input device 1 may determine a relative position (tilting) of manipulating body U1 with respect to touch-sensitive part S1 based on a balance of the changes in the capacitances of touch-sensitive part S1 and pressure-sensitive parts S2 and S3. The balance of the changes in capacitance may be evaluated based on, e.g. a magnitude relationship of the changes in the capacitances of pressure-sensitive parts S2 and S3 located at respective both sides of touch-sensitive part S1.

Input device 1 may further determine the degree of pressing (the amount of a push-in movement) of touch-sensitive part S1 in addition to the relative position (tilt) of manipulating body U1. When the change in the capacitance of touch-sensitive part S1 is large, the amount of the push-in movement is regarded as being large.

Input device 1 may further determine, based on the change in the capacitance of touch-sensitive part S1, whether or not elastic member 31 elastically deform (whether or not a click feeling is generated).

In accordance with the embodiment, since touch-sensitive part S1 and pressure-sensitive parts S2 and S3 are disposed side by side independently of each other, input device 1 may respond to various manipulations while preventing suppressing of generating a click feeling in touch-sensitive part S1.

In input device 1, touch-sensitive part S1 and pressure-sensitive parts S2 and S3 are individually accommodated inside housing 10 independently of each other. Cover film 11 provides a sealing structure, resulting in excellence in waterproof as well.

(3) Modified Examples

The embodiment described above is merely one example of the present disclosure. Various modifications to the embodiments described above may be made in accordance with design and the like as long as the object of the disclosure can be achieved. Moreover, functions similar to those of input system 100 according to the embodiments described above may be embodied by a control method of input system 100, a computer program, a non-transitory recording medium storing a computer program, or the like.

Modified examples of the embodiment described above will be listed below. The exemplary modifications described below are applicable in appropriate combination. Note that, hereinafter, the embodiment described above is referred to as a "basic example."

Controller 9 of input system 100 according to the present disclosure includes a computer system. The computer system has a major configuration that includes a processor and a memory, as hardware. The processor executes a program recorded in the memory of the computer system, thereby implementing the function of controller 9 of input system 100 according to the present disclosure. The program may be pre-recorded in the memory of the computer system, may be provided through a telecommunication line, and may be provided by being recorded in a non-transitory recording medium such as a memory card, an optical disk, a hard disk drive, or the like. The processor of the computer system is composed of one or a plurality of electronic circuits that include a semiconductor integrated circuit (IC) or a large-scale integrated circuit (LSI). The integrated circuit as referred to herein, such as an IC and LSI, is designated as a different name depending on its degree of integration, so that the integrated circuit includes ones called a system LSI, called Very Large Scale Integration (VLSI), or called Ultra Large Scale Integration (VLSI). In addition, the processor may also employ a Field-Programmable Gate Array (FPGA) capable of being programmed after the LSI has been manufactured, or a logical device capable of being subjected to either reconfiguration of the junction relationship inside the LSI or reconfiguration of the circuit partitions inside the LSI. Plural electronic circuits may be integrated on one chip or, alternatively, may be distributed and disposed on a plurality of chips. The plurality of chips may be integrated in one device or, alternatively, may be distributed and disposed in a plurality of devices. The computer system as referred to herein includes a microcontroller that includes one or more processors and one or more memories. Therefore, the microcontroller as well is composed of one or a plurality of electronic circuits that includes a semiconductor integrated circuit or a large-scale integrated circuit.

Moreover, it is not an essential configuration of input system 100 that a plurality of functions of controller 9 of input system 100 is integrated in one housing, so that the constitute elements of input system 100 may be distributed and disposed in a plurality of housings. Further, at least a part of the functions of controller 9, e.g., a part of the functions of input system 100, may be implemented by means of the cloud (cloud computing) or the like. On the contrary, a plurality of the functions of input system 100 may be integrated in one housing.

(3.1) Modified Example 1

The present modified example is different from the basic example in that, in FIG. 4, elastic insulators having electrically-insulating properties are disposed instead of conductive sheets 141 and 142. In this case, the elastic insulators preferably have relatively-high dielectric constants like, e.g. dielectric elastomers. In the case where the elastic insulators bodies are disposed instead of conductive sheets 141 and 142, insulating sheets 151 and 152 may be omitted. In this case, from the viewpoint of omitting insulating sheet 16 as well, an elastic insulator is preferably disposed instead of insulating sheet 16.

(3.2) Modified Example 2

Figure 9:
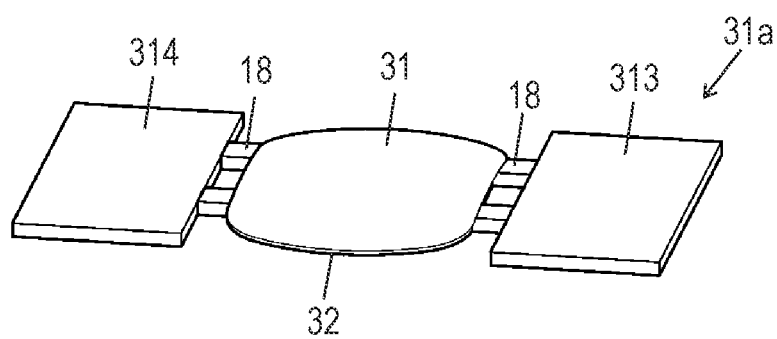
FIG. 9 is a perspective view of a movable electrode of an input device according to Modified Example 2.

FIG. 9 is a perspective view of movable electrodes 32, 313, and 314 of input device 1 according to Modified Example 2. In the modified example, input device 1 configured to output a change in a capacitance between movable electrode 313 and each of parts of fixed electrodes 74 and 711, and a change in a capacitance between movable electrode 314 and each of parts of fixed electrodes 72 and 712. Even in the present modified example, fixed electrodes 711 and 712 are connected to each other via connecting part 6 and are grounded through terminals 722 and 742. The modified example includes movable unitary electrode 31a composed of movable electrodes 313, 314, and 32 connected to each other via connecting parts 18 (see FIG. 9). Fixed unitary electrode 71 is grounded through terminals 722 and 742. In this case, input device 1 outputs a change in a capacitance between fixed electrode 74 and movable electrode 313, a change in a capacitance between fixed electrode 72 and movable electrode 314, and a change in a capacitance between fixed electrode 73 and movable electrode 32 from terminal 741, terminal 721, and terminal 731, respectively. Next, the total capacitance which is output when the center-pressing is performed will be described below. When the center-pressing is performed, fixed electrodes 711 and 712 are grounded as described above. In the basic example, the equivalent circuit of pressure-sensitive part S2 is composed of two capacitors C21 and C22 connected in series to each other, and the equivalent circuit of pressure-sensitive part S3 is composed of two capacitors C31 and C32 connected in series to each other (see FIG. 1B). In Modified Example 2, since movable electrodes 32, 313, and 314 are grounded as well, the equivalent circuit of pressure-sensitive part S2 is composed of only one capacitor C21, and the equivalent circuit of pressure-sensitive part S3 is composed of only one capacitor C31. Capacitors connected in series to each other have a total combined capacitance smaller than their individual capacitances to be connected. Each of pressure-sensitive parts S2 and S3 constitutes a single capacitor instead of capacitors connected in series to each other, consequently having a capacitance larger than the total capacitance of the capacitors connected in series to each other. This configuration increases sensitivity of pressure-sensitive parts S2 and S3. The output of pressure-sensitive part S2 or S3 in the one-sided pressing increases as well. Movable electrode 32 of touch-sensitive part S1 and movable electrodes 313 and 314 of pressure-sensitive parts S2 and S3 located on the left and the right are unified, and grounded, thereby increasing in sensitivity of the pressure-sensitive parts. In addition, movable unitary electrode 31a as a proximity electrode improves sensitivity of proximity detection.

(3.3) Modified Example 3

In this modified example, a combinations of movable electrodes 32, 313, and 314 and elastic members 31, 311, and 312 will be described. In the basic example, elastic member 31 is formed unitarily with movable electrode 32 while movable electrode 313 is separated from elastic member 311, and movable electrode 314 is separated from elastic member 312. However, the structure thereof is not limited to this configuration. For example, in the case where each of elastic members 31, 311, and 312 is made of a metal plate having a dome shape having electrical conductivity, movable electrode 32 may be formed unitarily with elastic members 31, movable electrode 313 may be formed unitarily with elastic members 311, and movable electrode 314 may be formed unitarily with elastic members 312. This configuration provides the same advantageous effects as the basic example according to Embodiment 1.

In the basic example, movable electrode 32 is formed on the lower surface of elastic member 31 as a dome-shaped body opposite to pressing surface 30 by plating. Elastic member 31 as the dome-shaped body may be separated from movable electrode 32 as another dome-shaped body. In this case, the dome-shaped body of elastic member 31 may not necessarily have electrical conductivity.

In the above description, possible forms of elastic member 31 and movable electrode 32 of touch-sensitive part S1 may include a single-piece conductive dome-shaped body, a structure in which the dome-shaped body and the movable electrode are unitarily formed, and a structure in which the dome-shaped body and the movable electrode are separated.

(3.4) Modified Example 4

Next, configurations of elastic members 311 and 312 and movable electrodes 313 and 314 of pressure-sensitive parts S2 and S3 will be described below. In the basic example, each of elastic members 311 and 312 has a dome shape, and movable electrodes 313 and 314 are separated from elastic members 311 and 312, respectively. In Modified Example 3, elastic members 311 and 312 are made of metal domes and also function as elastic members 313 and 314, respectively. In Modified Example 4, each of elastic members 311 and 312 is made of a stainless-steel dome. Movable electrodes 313 and 314 are formed on lower surfaces of the stainless-steel domes opposite to the pressing surfaces by silver plating. Modified Example 4 provides the same advantageous electrical effects as the basic example.

In this modified example, the stainless-steel dome and silver plating is described, but these materials are not intended to impose any limitation to the disclosure.

In the above description, possible forms of elastic member 31 and movable electrode 32 of touch-sensitive part S1 of Modified Example 3, elastic member 311 and movable electrode 313 of pressure-sensitive part S2 of Modified Example 4; and elastic member 312 and movable electrode 314 of pressure-sensitive part S3 of Modified Example 4 have been described. Examples of the possible forms include: a single-piece conductive dome-shaped body, a structure in which the dome-shaped body and the movable electrode are unitarily formed, and a structure in which the dome-shaped body and the movable electrode are separated. In touch-sensitive part S1 and pressure-sensitive parts S2 and S3, even in the case where another form is obtained by combining appropriately among the possible forms, the same advantageous effects can be achieved. Moreover, regarding the possible forms of elastic member 31 and elastic members 311 and 312, touch-sensitive part S1 and at least one of pressure-sensitive parts S2 and S3 may have dome shapes.

(3.5) Modified Example 5

Figure 10A:
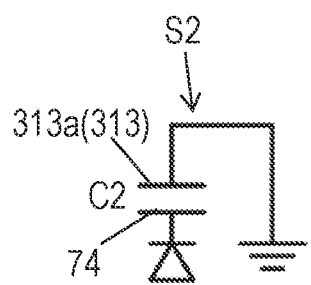
FIG. 10A is an equivalent circuit diagram of an input device according to Modified Example 5.
Figure 10B:
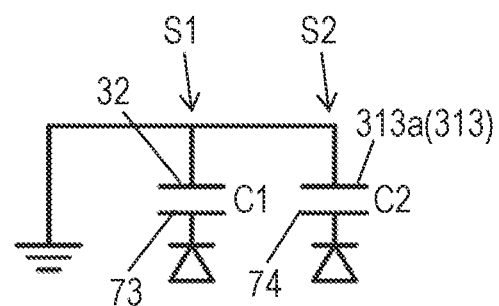
FIG. 10B is an equivalent circuit diagram of the input device according to Modified Example 5.

Modified Example 5 is different from the basic example in that the input device includes one touch-sensitive part S1 and one pressure-sensitive part S2 but does not include pressure-sensitive part S3. For example, in Modified Example 5, one movable electrode 313 is disposed at a side (e.g., in rightward direction Dr out of the leftward and rightward directions) of movable electrode 32 when viewed in the pressing direction of movable electrode 32. In this case, only one pressure-sensitive part S2 disables the detection of left and right by one-sided pressing. Besides this, even Modified Example 5 detects pushing-in and clicking. In the case that terminal 742 is grounded, the one-sided pressing causes input device 1 to constitute the equivalent circuit shown in the circuit diagram of FIG. 10A in which capacitor C2 has total capacitance Cb, which does not allow the detection of left and right. On the other hand, center-pressing causes input device 1 to constitute the equivalent circuit shown in the circuit diagram of FIG. 10B, in which case a signal in accordance with capacitor C1 is output from terminal 731 and a signal in accordance with capacitor C2 is output from terminal 741.

Exemplary Embodiment 2

A device according to Exemplary Embodiment 2 is different from Embodiment 1 in that a manipulation of manipulating body U1 is detected. Differences will be described below. Components identical to those of Embodiment 1 are denoted by the same reference numerals, and their descriptions will be omitted as appropriate.

Figure 11:
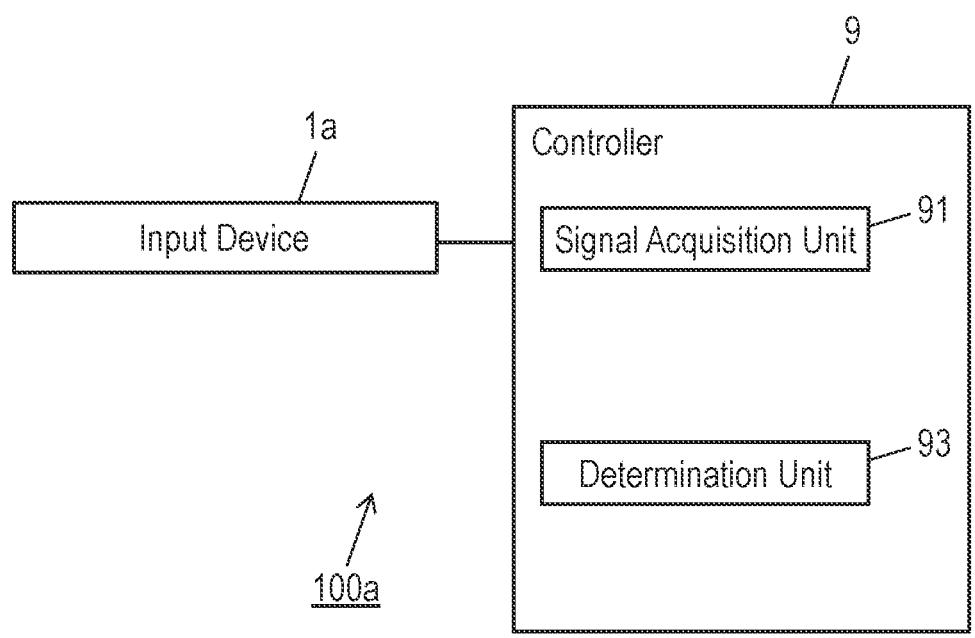
FIG. 11 is a block diagram of an input system according to Exemplary Embodiment 2.

FIG. 11 is a block diagram of input system 100*a* according to Embodiment 2. Input system 100*a* includes input device 1*a*. Input device 1*a* includes movable unitary electrode 31*a* shown in FIG. 9 in which touch-sensitive part S1 is formed unitarily with pressure-sensitive parts S2 and S3. In fixed unitary electrode 71, fixed electrode 711 is connected to fixed electrode and 712 via connecting part 6. Fixed unitary electrode 71 is grounded. Terminals 721, 741, 722, 742, and 731 are connected to controller 9. Movable unitary electrode 31*a* used as a proximity electrode increases sensitivity of proximity detection.

Upon receiving signals from terminals 722 and 742, controller 9 switches between a hovering-detection mode and a pressure-detection mode in which sensitivity of pressure-sensitive parts S2 and S3 are enhanced as described in Modified Example 2. The controller is standby in, e.g. the hovering-detection mode. Then, upon detecting proximity, the controller switches to the pressure-detection mode. Both the hovering-detection mode and the pressure-detection mode may thus be switched by time-division operation.

FIGS. 12A to 12D illustrate manipulations of manipulating body U1 on input device 1*a*. The manipulation according to the embodiment includes directivity of the movement of manipulating body U1 with respect to touch-sensitive part S1. The manipulation according to the embodiment includes the state that relates to at least one of a first manipulation process and a second manipulation process. In the first manipulation process, manipulating body U1 approaches pressing surface 30 and applies pressure (touching, pushing, or clicking) to pressing surface 30. In the second manipulation process, after a pressure is applied to pressing surface 30, manipulating body U1 is removed from pressing surface 30.

The manipulation includes the following seven manipulations. The manipulations are just examples, and are not limited. Determination unit 93 may be configured to determine one or more manipulations among the seven manipulations. For example, determination unit 93 may be configured to determine only whether or not the manipulation of manipulating body U1 is a second manipulation, and alternatively, to determine whether the manipulation is the second manipulation or a third manipulation.

Figure 12A:
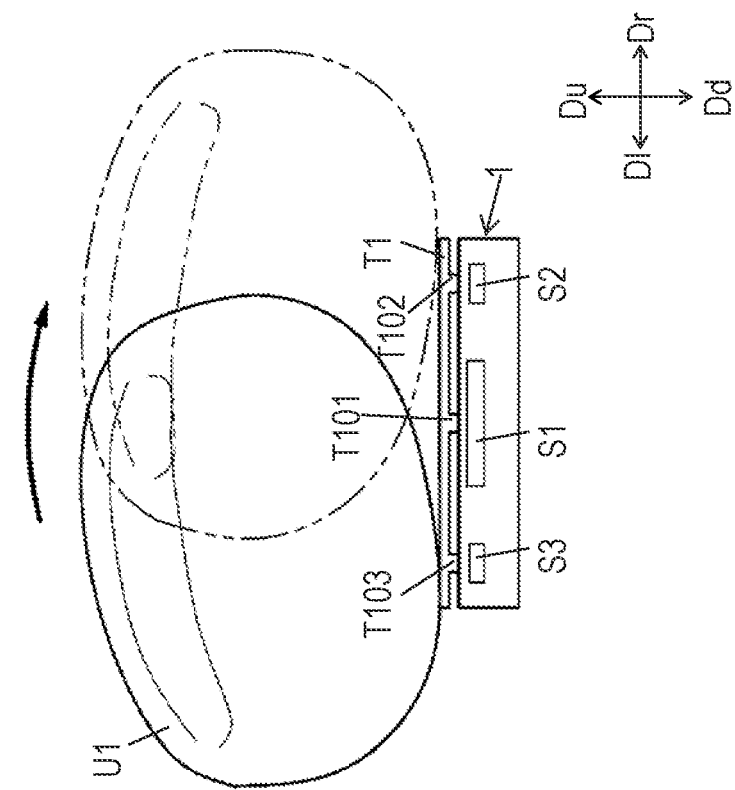
FIG. 12A illustrates a manipulation of a manipulating body manipulating the input device according to Embodiment 2.

A first manipulation is a series of manipulations, as shown in FIG. 12A, in which manipulating body U1 touches two pressure-sensitive parts S2 and S3 substantially simultaneously and clicks touch-sensitive part S1 via manipulation plate T1. Projections T101-T103 are provided on the lower surface of manipulation plate T1. Projections T101-T103 apply pressure to push plates 131, 132, and 14.

Figure 12B:
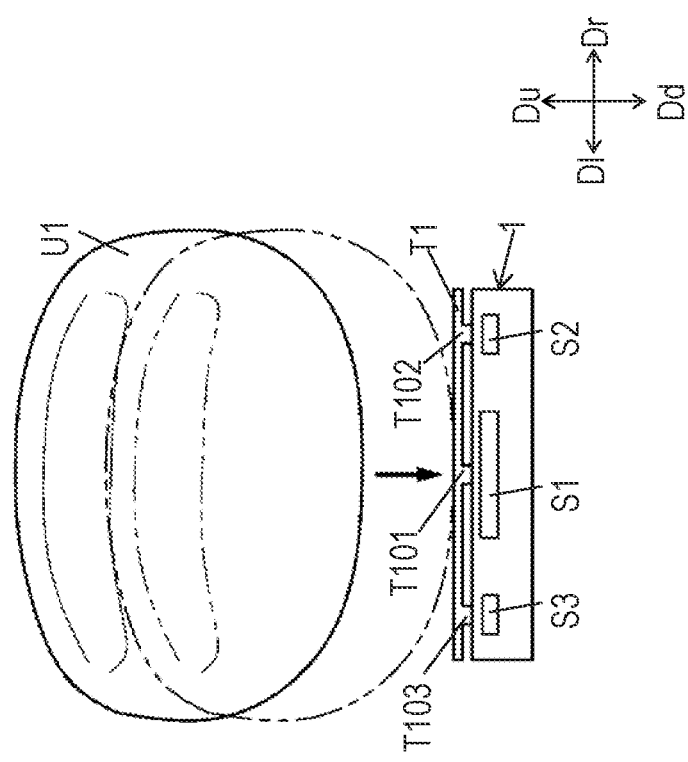
FIG. 12B illustrates a manipulation of a manipulating body manipulating the input device according to Embodiment 2.

A second manipulation is a series of manipulations, as shown in FIG. 12B, in which manipulating body U1 touches pressure-sensitive part S3 on the left side before manipulating body U1 clicks touch-sensitive part S1 via manipulation plate T1, and then, manipulating body U1 further moves substantially along an arcuate locus in rightward direction Dr to touch pressure-sensitive part S2 on the right side via manipulation plate T1. The movement of manipulating body U1 along the arcuate locus causes manipulation plate T1 to slightly turn substantially along an arcuate locus about projection T101 accordingly.

A third manipulation is a series of manipulations in which, contrary to the second manipulation, manipulating body U1 moves substantially along an arcuate locus, so that manipulating body U1 touches pressure-sensitive part S2 on the right side and pressure-sensitive part S3 on the left side via manipulation plate T1 in this order.

Figure 12C:
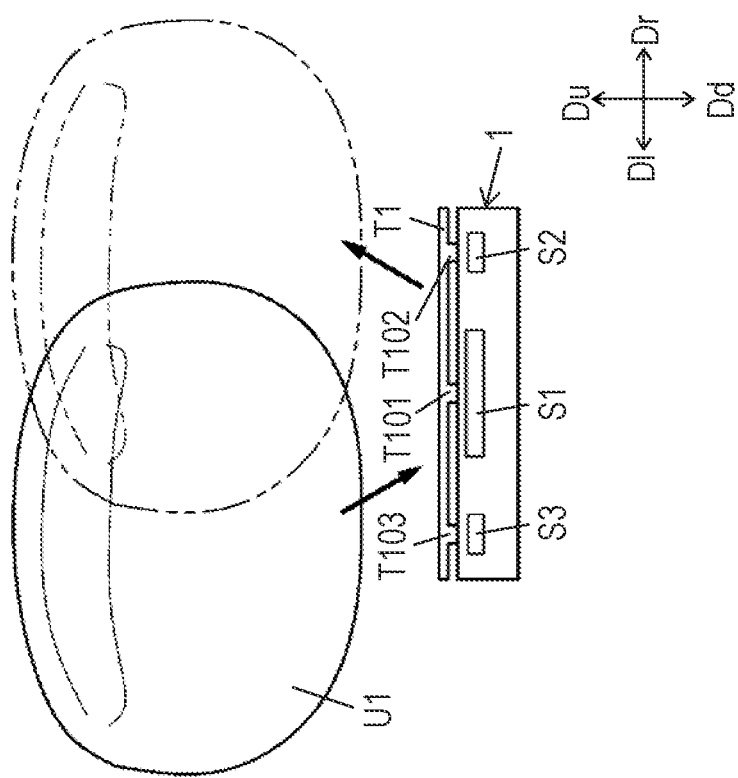
FIG. 12C illustrates a manipulation of a manipulating body manipulating the input device according to Embodiment 2.

A fourth manipulation is a series of manipulations, as shown in FIG. 12C, in which manipulating body U1 slides substantially on the upper surface of manipulation plate T1 from pressure-sensitive part S3 on the left side through touch-sensitive part S1 to pressure-sensitive part S2 on the right side via manipulation plate T1. In this manipulation, manipulating body U1 manipulates touch-sensitive part S1 by touching or pushing manipulation plate T1 without generating a clicking feeling while sliding.

A fifth manipulation is a series of manipulations in which, contrary to the fourth manipulation, manipulating body U1 slides on the upper surface of manipulation plate T1 from pressure-sensitive part S2 on the right side to pressure-sensitive part S3 on the left side via manipulation plate T1.

Determination unit 93 thus determines not only the type of manipulation (touch, push, and click) to touch-sensitive part S1 but also the directivity (the order of manipulations). The directivity is determined from both directions: One is the direction (in the illustrated cases, one of rightward direction Dr, leftward direction Dl, and upward direction Du) from which manipulating body U1 manipulates touch-sensitive part S1; the other is the direction in which manipulating body U1 has is removed. Controller 9 is configured to transmit, to other circuit modules, a control signal according to both the type of the manipulation and the direction of movement of manipulating body U1. Determination unit 93 performs processes corresponding to various manipulations.

Instead of the touch determination for each of pressure-sensitive parts S2 and S3 described above, determination unit 93 may perform proximity determination, which is not accompanied by touching, by increasing its sensitivity by adjusting a specified value or the like. The following sixth and seventh manipulations are examples of the manipulations relating to the proximity determination.

Figure 12D:
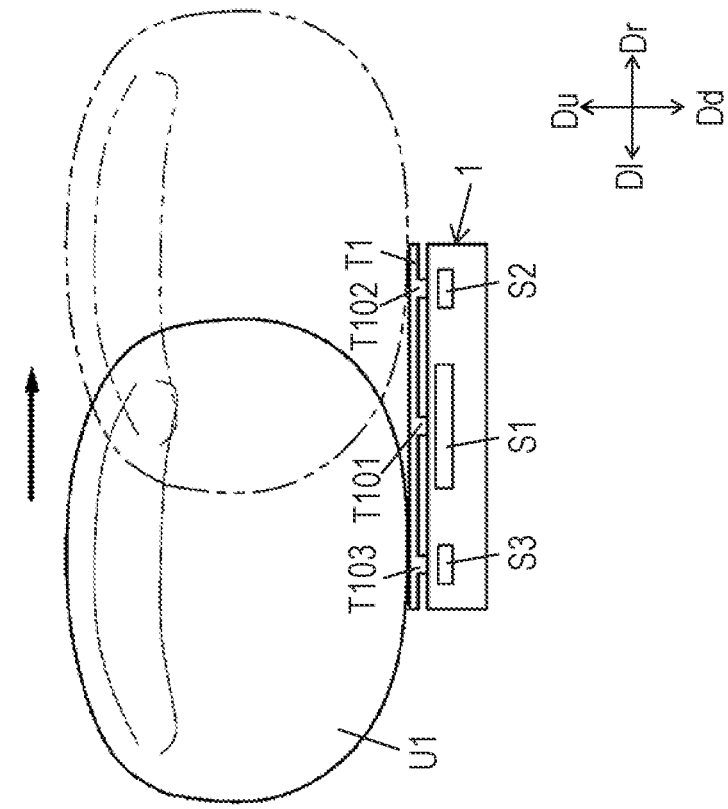
FIG. 12D illustrates a manipulation of a manipulating body manipulating the input device according to Embodiment 2.

The sixth manipulation is a series of manipulations (hovering manipulation) in which, as shown in FIG. 12D, manipulating body U1 obliquely moves to touch-sensitive part S1 from a position above pressure-sensitive part S3 on the left side, clicks touch-sensitive part S1 via manipulation plate T1, and then, is removed there away from touch-sensitive part S1 toward another position above pressure-sensitive part S2 on the right side. In this manipulation, manipulating body U1 moves on a locus having substantially a V-shape.

A seventh manipulation is a series of manipulations in which, contrary to the sixth manipulation, manipulating body U1 moves to touch-sensitive part S1 from a position above pressure-sensitive part S2 on the right side, clicks touch-sensitive part S1 via manipulation plate T1, and then, is removed away from touch-sensitive part S1 toward another position above pressure-sensitive part S3 on the left side.

In the sixth and seventh manipulations, determination unit 93 determines not which of pressure-sensitive parts S2 and S3 on the left and right sides the manipulating body touches, but from which side of pressure-sensitive parts S2 and S3 the manipulating body approaches, or toward which side of pressure-sensitive parts S2 and S3 the manipulating body is removed away. Determination unit 93 performs processes corresponding to further various manipulations.

The manipulation may not necessarily include directivity of the movement of manipulating body U1. The manipulation may simply include a relative position of manipulating body U1 (may be the tilt of manipulating body U1, for example). The following eighth and ninth manipulations are examples of the manipulations relating to determination of the relative position of manipulating body U1.

In the eighth manipulation, manipulating body U1 tilted down on the left is located at both pressure-sensitive part S3 on the left side and touch-sensitive part S1.

In the ninth manipulation, contrary to the eighth manipulation, manipulating body U1 tilted down on the right is located at both pressure-sensitive part S2 on the right side and touch-sensitive part S1.

In the determination of the eighth and ninth manipulations, determination unit 93 determines in which state of being biased toward pressure-sensitive part S2 on the right or being biased toward pressure-sensitive part S3 on the left manipulating body U1 has applied the pressing to touch-sensitive part S1.

FIGS. 12A-12D are schematic diagrams of input device 1a viewed in the forward direction shown in FIG. 2. In FIGS. 12A-12D, the left-right dimension of input device 1a is slightly smaller than the width of a human's fingertip (manipulating body U1). The left-right dimension of input device 1a is, e.g. 9 mm, however, it is not limited to this.

The method of using the device is the same as Embodiment 1, and its description will be omitted.

(4) Advantageous Effects

As described above, an input device (1) according to a first aspect includes fixed electrodes (72, 74, 711, 712), a movable electrode (32), and movable electrodes (313, 314). The device detects outputs at least changes of capacitances between the movable electrodes (313, 314) and a part of or all of the fixed electrodes (72, 74, 711, 712). The input device (1) includes an elastic member (31) that deforms when the movable electrode (32) moves, and elastic members (311, 312) that deform when the movable electrodes (313, 314) move.

In accordance with the first aspect, the input device can advantageously respond to various manipulations while preventing suppressing of generating a click feeling.

An input device (1) according to a second aspect is the input device according to the first aspect, in which, in correlations between forces applied to the elastic members (311, 312) and the amounts of displacements of the elastic members (311, 312), the elastic members (311, 312) each have neither a local maximum value nor a local minimum value. Alternatively, in the case where the elastic members (311, 312) each exhibit have a local maximum value and a local minimum value, a difference between the local maximum value and the local minimum value is smaller than a difference between the local maximum value and the local minimum value of the elastic member (31).

In accordance with the second aspect, the elastic members (311, 312) advantageously have no influence on a click feeling generated when pressing the elastic member (31). That is, while enhancing the feel of pressing the movable electrode (32), it is possible to increase the accuracy of detecting the change in capacitances between the movable electrodes (313, 314) and either a part of or all of the fixed electrodes (72, 74, 711, 712).

An input device (1) according to a third aspect is the input device according to the first or second aspect, in which the movable electrodes (313, 314) are disposed at the respective sides of the movable electrode (32) when viewed in the pressing direction of the movable electrode (32).

In accordance with the third aspect, the movable electrodes (313, 314) located at the respective sides of the movable electrode (32) when viewed in the pressing direction of the movable electrode (32) increase the accuracy of detecting the change in capacitances between the movable electrodes (313, 314) and either a part of or all of the fixed electrodes (72, 74, 711, 712) while obtaining the feel of pressing the movable electrode (32).

An input device (1) according to a fourth aspect is the input device according to the third aspect, in which a pair of the movable electrodes (313, 314) are disposed on the respective both sides of the movable electrode (32) when viewed in the pressing direction of a pressing surface (30) of the movable electrode (32).

In accordance with the fourth aspect, while obtaining the feel of pressing the movable electrode (32), it is possible to increase the accuracy of detecting the change in capacitance between the movable electrodes (313, 314) and either a part of or all of the fixed electrodes (72, 74, 711, 712). In addition, when a tilting manipulation has been made for the movable electrode (32), this configuration advantageously determines which side the tilting manipulation has been made from.

An input device (1) according to a fifth aspect is the input device according to any one of the first to fourth aspects. The input device further includes a connecting part connecting the movable electrode (32) to the movable electrodes (313, 314).

In accordance with the fifth aspect, a common electrode is formed by connecting the movable electrode (32) to the movable electrodes (313, 314), and further connecting them to the fixed electrodes (711, 712). Such a common electrode allows, depending on the way to cope with the common electrode, increases sensitivity of a hovering detection or, alternatively, an improvement in detection of the change in capacitance between the movable electrodes (313, 314) and either a part of or all of the fixed electrodes (72, 74, 711, 712).

An input device (1) according to a sixth aspect is the input device according to any one of the first to fifth aspects, in which the input device (1) further output a change in capacitance generated in accordance with a hovering manipulation.

In accordance with the sixth aspect, the input device advantageously responds to various manipulations while preventing hindrance to generating a click feeling. First, the movable electrode (32) is connected to the movable electrodes (313, 314). The thus-coupled electrodes are also connected to the fixed electrodes (711, 712), thereby forming the common electrode. The common electrode is connected to a hovering detection circuit, which outputs an analog electric signal that represents change in capacitance in accordance with the hovering manipulation.

An input device (1) according to a seventh aspect is the input device according to any one of the first to sixth aspects. The input device further includes a cover film (11) and push plates (14, 131, 132) disposed between the cover film (11) and the elastic members (31) and elastic members (311, 312), respectively. The push plates (14, 131, 132) have electrical insulating properties, and cause the elastic member (31) and elastic members (311, 312) to elastically deform, respectively.

In accordance with the seventh aspect, the push plates (131, 132) are configured to cause the elastic members (311, 312) to elastically deform. The push plate (14) is configured to cause the elastic member (31) to elastically deform. The push plates provide an advantage that the pressure can be stably applied to the pressing surfaces.

An input device (1) according to an eighth aspect is the input device according to any one of the first to seven aspects, in which the elastic member (31) and at least one of the elastic members (311, 312) have a dome shape.

In accordance with the eighth aspect, the input device advantageously responds to various manipulations while preventing hindrance to generating a click feeling. The elastic member (31) having a dome shape facilitates getting a click feeling provided by the elastic member made of bendable material.

An input system (100) according to a ninth aspect includes an input device (1) according to any one of the first to eighth aspects, a determination unit (93), and a signal acquisition unit (91) configured to acquire an output signal output from the input device (1). The determination unit (93) is configured to determine, bases on the output signal, the manipulation of a manipulating body (U1) that manipulates the input device (1).

In accordance with the ninth aspect, the input system advantageously responds to various manipulations while preventing hindrance to generating a click feeling.

In the embodiments, terms, such as "upward direction," "rightward direction," "forward direction," "upper surface," and "above," indicating directions indicate relative directions determined only by the relative positional relationship of constituent components of the input device, and do not indicate absolute directions, such as a vertical direction.

REFERENCE MARKS IN THE DRAWINGS 1, 1*a* input device
10 housing
11 cover film
12 body
131, 132, 14 push plate
141, 142 conductive sheet
151, 152 insulating sheet
16 insulating sheet
18 connecting part 2 detection unit
30 pressing surface
31 elastic member (first elastic member)
32 movable electrode (first movable electrode)
311 elastic member (second elastic member)
312 elastic member (third elastic member)
313 movable electrode (second movable electrode)
314 movable electrode (third movable electrode)
31a movable unitary electrode
71 fixed unitary electrode
711, 712, 72, 73, 74 fixed electrode
721 terminal (second terminal)
722 terminal
731 terminal
741 terminal (first terminal)
742 terminal
91 signal acquisition unit
93 determination unit
100, 100a input system
S1 touch-sensitive part
S2, S3 pressure-sensitive part

The invention claimed is:

1. An input device comprising:
a first fixed electrode;
a first movable electrode;
a second movable electrode;
a first elastic member having a portion and being configured to deform so as to displace the portion of the first elastic member in accordance with a movement of the first movable electrode;
a second elastic member having a portion and being configured to deform so as to displace the portion of the second elastic member in accordance with a movement of the second movable electrode;
a first terminal configured to output a signal corresponding to a change in a capacitance between the first fixed electrode and the second movable electrode;
a second fixed electrode;
a third movable electrode;
a third elastic member having a portion and being configured to deform so as to displace the portion of the third elastic member in accordance with a movement of the third movable electrode; and
a second terminal configured to output a signal corresponding to a change in a capacitance between the second fixed electrode and the third movable electrode, wherein
the first elastic member is configured to deform upon the first movable electrode pressed in a pressing direction,
the second movable electrode is disposed at a side of the first movable electrode when viewed in the pressing direction, and
the third movable electrode is disposed opposite to the second movable electrode with reference to the first movable electrode when viewed in the pressing direction.

2. The input device of claim 1, wherein a load applied to the second elastic member increases as a stroke of a displacement of the portion of the second elastic member increases such that the load has neither a local maximum value nor a local minimum value.

3. The input device of claim 1, wherein
a load applied to the first elastic member changes as a stroke of a displacement of the portion of the first elastic member increases such that the load applied to the first elastic member has a first local maximum value and a first local minimum value,
a load applied to the second elastic member changes as a stroke of a displacement of the portion of the second elastic member increases such that the load applied to the second elastic member has a second local maximum value and a second local minimum value, and
a difference between the second local maximum value and the second local minimum value is smaller than a difference between the first local maximum value and the first local minimum value.

4. The input device of claim 1, wherein a load applied to the third elastic member increases as a stroke of a displacement of the portion of the third elastic member increases such that the load applied to the third elastic member has neither a local maximum value nor a local minimum value.

5. The input device of claim 1, wherein
a load applied to the first elastic member changes as a stroke of a displacement of the portion of the first elastic member increases such that the load applied to the first elastic member has a first local maximum value and a first local minimum value,
a load applied to the third elastic member changes as a stroke of a displacement of the portion of the third elastic member increases such that the load applied to the third elastic member has a second local maximum value and a second local minimum value, and
a difference between the second local maximum value and the second local minimum value is smaller than a difference between the first local maximum value and the first local minimum value.

6. An input system, comprising:
an input device of claim 1;
a signal acquisition unit configured to acquire an output signal output from the first terminal of the input device; and
a determination unit configured to determine, based on the output signal, a manipulation of a manipulating body manipulates the input device.

7. The input device of claim 1, further comprising a connecting part connecting the first movable electrode to the second movable electrode.

8. The input device of claim 1, wherein the first terminal is configured to further output a change in a capacitance generated in accordance with a hovering manipulation.

9. The input device of claim 1, further comprising:
a cover film covering the first elastic member and the second elastic member;
a first push plate disposed between the cover film and the first elastic member, the first push plate being configured to cause the first elastic member to elastically deform; and
a second push plate disposed between the cover film and the second elastic member, the second push plate being configured to cause the second elastic member to elastically deform.

10. The input device of claim 1, wherein at least one of the first elastic member and the second elastic member has a dome shape.

11. The input device of claim 1, wherein the first movable electrode, the second movable electrode, and the third movable electrode are away from one another when viewed in the pressing direction.

* * * * *